United States Patent
Ide et al.

(10) Patent No.: US 7,136,340 B2
(45) Date of Patent: Nov. 14, 2006

(54) SEMICONDUCTOR INTEGRATED CIRCUIT AND MEDIUM RECORD PLAYBACK DEVICE

(75) Inventors: Hiroshi Ide, Ueda (JP); Satoshi Fujita, Oomagari (JP)

(73) Assignees: Renesas Technology Corp., Tokyo (JP); Akita Electronics Systems Co., Ltd., Akita (JP)

( * ) Notice: Subject to any disclaimer, the term of this patent is extended or adjusted under 35 U.S.C. 154(b) by 531 days.

(21) Appl. No.: 10/720,179

(22) Filed: Nov. 25, 2003

(65) Prior Publication Data

US 2004/0145983 A1    Jul. 29, 2004

(30) Foreign Application Priority Data

Jan. 27, 2003   (JP)   ............... 2003-017460

(51) Int. Cl.
    *G11B 7/00*   (2006.01)
(52) U.S. Cl. ............... 369/53.34; 369/47.27; 369/47.26
(58) Field of Classification Search ............ None
    See application file for complete search history.

(56) References Cited

U.S. PATENT DOCUMENTS 6,246,649 B1 *   6/2001   Ohta et al. ........... 369/47.28
6,987,719 B1 *   1/2006   Mashimo ............ 369/53.34
7,057,985 B1 *   6/2006   Kobayashi et al. ... 369/47.28
2005/0073922 A1* 4/2005   Mahr et al. ......... 369/47.27

FOREIGN PATENT DOCUMENTS

JP   2000-231726       2/1999
JP   11-203681    *    7/1999

* cited by examiner

*Primary Examiner*—Thang V. Tran
*Assistant Examiner*—Christopher Lamb
(74) *Attorney, Agent, or Firm*—Reed Smith LLP; Stanley P. Fisher, Esq.; Juan Carlos A. Marquez, Esq.

(57) ABSTRACT

A disk type record playback device having a wobble signal extracting bandpass filter for controlling a filter's center frequency according to a frequency follow-up control loop including a dummy filter identical in configuration to a filter to be controlled, and a phase comparator is capable of controlling the center frequency of the bandpass filter with satisfactory accuracy. A frequency variable lowpass filter is provided in a preceding stage of the phase comparator constituting a frequency follow-up circuit and supplies a signal obtained by eliminating harmonic components from a frequency follow-up clock signal to the phase comparator. A cutoff frequency of the lowpass filter is changed in cooperation with a center frequency of the bandpass filter, based on a signal outputted from the frequency follow-up control loop.

6 Claims, 8 Drawing Sheets

DETECTED ERROR

INSIDE FREQUENCY:
FUNDAMENTAL WAVE
818kHz

INSIDE FREQUENCY:
THIRD HARMONIC
2.45MHz

OUTSIDE FREQUENCY:
FUNDAMENTAL WAVE
2.04MHz

OUTSIDE FREQUENCY:
THIRD HARMONIC
6.13MHz

SEMICONDUCTOR INTEGRATED CIRCUIT AND MEDIUM RECORD PLAYBACK DEVICE

BACKGROUND OF THE INVENTION

The present invention relates to a frequency control technology of a filter circuit, and to a technology effective if applied to a case in which the frequency of a filter to be controlled is controlled by a PLL loop including a dummy filter identical in configuration to the filter, e.g., a technology effective if applied to a wobble signal extracting circuit used in a DVD (Digital Versatile Disk) device.

In a disk type record playback device like a DVD-RAM (Random Access Memory), there have heretofore been known rotation control called a CLV (Constant Linear Velocity) system which makes constant a velocity, i.e., a linear velocity of a pickup relative to a disk to thereby perform read/write, and rotation control called a CAV (Constant Angular Velocity) system which makes constant a rotational velocity of a disk regardless of the position of a pickup to thereby perform read/write.

The device having adopted the CLV system has an advantage in that while the rotation control becomes complex because the rotational velocity of the disk must be changed according to a track position of the pickup in order to make the linear velocity of the pickup constant, a processing speed at a data processing circuit like a DSP (Data Processor) for processing a read signal may be constant, thus making it possible to simplify a signal processing system.

On the other hand, in the device having adopted the CAV system, the rotation control becomes simple because the rotational velocity of the disk may be controlled constant regardless of a track position of the pickup. However, since the relative velocity of the pickup, i.e., the frequency of a read signal changes depending on the position of the pickup in a diameter direction, the signal-processing speed at the data processing circuit must be changed and hence a signal processing system becomes complex.

As a recordable/reproducible optical disk, there has heretofore been known one formed with wobble defined as an index for swelling or waving an information recording track of a disk surface to thereby fetch out position information. In a DVD device which effects record/playback on a disk having wobble, a rough area of a track or a sector or the like is determined or judged based on address information pre-written in the disk, and a detailed recording position is detected by the wobble, whereby such control as to write data therein is performed.

In order to detect the wobble on the disk surface and thereby generate a clock signal in the DVD device of such a control system, a signal read from a pickup is passed through a bandpass filter to remove noise and thereafter digitized by a comparator or the like, thereby generating the corresponding clock signal. In order to accurately detect the wobble, the bandpass filter that extracts a wobble signal from the read signal is required to have a narrow-band filter characteristic.

Meanwhile, in an optical disk type record playback device, the rotational velocity of a disk might be changed stepwise like an equi- or same-speed or a quad-speed. Since the frequency of the wobble signal varies depending on a double-speed mode, there is a need to switchably set the center frequency of the bandpass filter according to the double-speed mode. As a control system for changing the center frequency of the bandpass filter, there has heretofore been proposed a system for controlling an intermediate frequency of a bandpass filter by a frequency follow-up control loop including a dummy filter identical in configuration to a filter to be controlled, and a phase comparator (see, for example, a patent document 1 shown below).

Japanese Unexamined Patent Publication No. 2000-231726

SUMMARY OF THE INVENTION

A signal close to a sine wave passed through the dummy filter is inputted to one input terminal of the phase comparator of the frequency follow-up control loop containing the dummy filter. Therefore, when a pulse-shaped clock signal digitized by a comparator or the like is inputted to the other input terminal of the phase comparator as it is, the sine wave and a rectangular wave are phase-compared so that an accurate phase comparison cannot be performed. It is therefore desirable to cause a clock signal to pass through a lowpass filter to attenuate its harmonic components and input it to the phase comparator.

However, the harmonic components of the clock signal cannot be sufficiently attenuated where a primary filter is used as such a lowpass filter. Therefore, the clock signal having passed through the lowpass filter results in a waveform whose rise and fall change steeply as indicated by a solid line in FIG. 10. It has been manifested by the present inventors that a detected error occurs when the signal having such a waveform and such a sine wave (band-passed signal) as indicated by a broken line are phase-compared. Since a difference of about 2.5 times occurs in a pickup's relative velocity between the inner and outer peripheries of the disk in the CAV type DVD device, a difference of about 2.5 times occurs even in the frequency of the clock signal generated based on the wobble. Therefore, the frequency characteristic required for the lowpass filter becomes very strict.

Now consider specifically where the frequency of a clock at the time that the pickup is placed in the inner periphery of the disk in the same-speed mode is 818 kHz, for example, in the CAV type DVD device. At this time, the frequency of a tertiary harmonic contained in the clock signal is 2.45 MHz. On the other hand, when the pickup is moved to the outer periphery of the disk in the same-speed mode, the frequency of the clock is raised to 2.04 MHz equal to 2.5 times the frequency at the inner periphery thereof. As shown in FIG. 11, a difference of only 0.41 MHz occurs between the outside frequency (2.04 MHz) of a clock and the outside frequency of a tertiary harmonic (2.45 MHz).

Therefore, when a cutoff frequency fc of the lowpass filter is fixed, fc must be placed within an extremely narrow range like a range between 2.04 MHz and 2.45 MHz as indicated by a broken line B, so that it becomes very difficult to realize its frequency characteristic.

Further, the conventional CLV type optical disk type record playback device is generally used with a discrete type filter like a switched capacitor filter or an FIR (Finite Impulse Response) filter as a filter circuit. The discrete type filter is capable of easily controlling an intermediate frequency and a cutoff frequency by changing the frequency of a sampling clock. Therefore, it is effective to configure such a device as to be capable of controlling the intermediate frequency of the bandpass filter as in the invention of the prior application. However, a high-accuracy analog sampling circuit becomes difficult in high-speed operation, and a limitation is imposed on a rise in sampling clock frequency.

Thus, when it is desired to configure a record playback device capable of coping with a higher double-speed mode, its coping becomes difficult where a discrete type filter is used as a wobble signal extracting filter. In contrast, continuous filters like an active filter and a passive filter encounters difficulties in controlling the intermediate frequency but becomes easy to increase in speed. However, passive filters like an RC filter and an LC filter are hard to obtain sufficient frequency control accuracy where it is configured as a semiconductor integrated circuit.

An object of the present invention is to make it possible to control an intermediate frequency of a bandpass filter with more satisfactory accuracy in a disk record playback device having a wobble signal extracting bandpass filter for controlling a filter's intermediate frequency by a frequency follow-up control loop including a dummy filter identical in configuration to a filter to be controlled, and a phase comparator.

Another object of the present invention is to provide a semiconductor integrated circuit employed in a CVA (constant in angular velocity) type DVD device, wherein a filter capable of performing a high-speed operation and high-accuracy frequency control is built, and a disk record playback device using it.

The above, other objects and novel features of the present invention will become apparent from the description of the present Specification and the accompanying drawings.

Summaries of representative ones of the inventions disclosed in the present application will be described as follows:

There is provided a disk record playback device having a wobble signal extracting bandpass filter for controlling a center frequency by a frequency follow-up control loop including a dummy filter identical in configuration to a bandpass filter to be controlled, and a phase comparator, wherein a frequency variable low-pass filter is provided in a preceding stage of the phase comparator and supplies a signal obtained by eliminating harmonic components from a frequency follow-up clock signal to the phase comparator, and a cutoff frequency of the lowpass filter is controlled in cooperation with a center frequency of the bandpass filter, based on a signal outputted from the frequency follow-up control loop.

According to the above means, the frequency variable filter is used as the lowpass filter for removing the harmonic components from the frequency follow-up clock signal. Therefore, when the present device is applied to a CAV type DVD device, the cutoff frequency of the lowpass filter is changed according to the position of a pickup in a diameter direction to thereby make it possible to effectively eliminate the harmonic components of the clock signal supplied to the phase comparator. Thus, the center frequency of the bandpass filter can be controlled with satisfactory accuracy.

Preferably, a secondary or higher continuous filter, more preferably, an active filter is used as the low-pass filter. Since the secondary or higher filter is used as the lowpass filter, harmonic components can be sufficiently eliminated. It is thus possible to reduce a phase detected error at the phase comparator and enhance the accuracy of control of the center frequency of the bandpass filter. Using the continuous filter as the bandpass filter makes it easy to cope with its speeding up. Further, when the bandpass filter is formed on a semiconductor chip, satisfactory frequency control accuracy can be obtained.

Further, the present invention is configured in such a manner that when the output amplitude of the dummy filter contained in the frequency follow-up control loop for controlling the center frequency of the bandpass filter falls short of a predetermined level, a frequency follow-up clock signal inputted to the phase comparator is supplied by bypassing the lowpass filter.

There is a fear that since the center frequency of the bandpass filter and the cutoff frequency of the lowpass filter become undefined at the pull-in start of the frequency follow-up control loop, the level of amplitude of the clock signal inputted to the phase comparator is reduced when a narrow-band filter is used as the bandpass filter or a frequency-variable filter is used as the lowpass filter, so that the normal result of phase comparison is not obtained, and hence the frequency follow-up control loop is not locked for a long, long time or locked at an undesired frequency, whereby the intermediate frequency of the bandpass filter falls outside a desired range. Therefore, when the output amplitude of the dummy filter falls short of the predetermined level, the clock signal inputted to the phase comparator is supplied by bypassing the low-pass filter, thereby making it possible to avoid the frequency follow-up control loop from being destabilized or causing pseudo lock.

DETAILED DESCRIPTION OF THE PREFERRED EMBODIMENTS

Preferred embodiments of the present invention will hereinafter be described based on the accompanying drawings.

Figure 1:
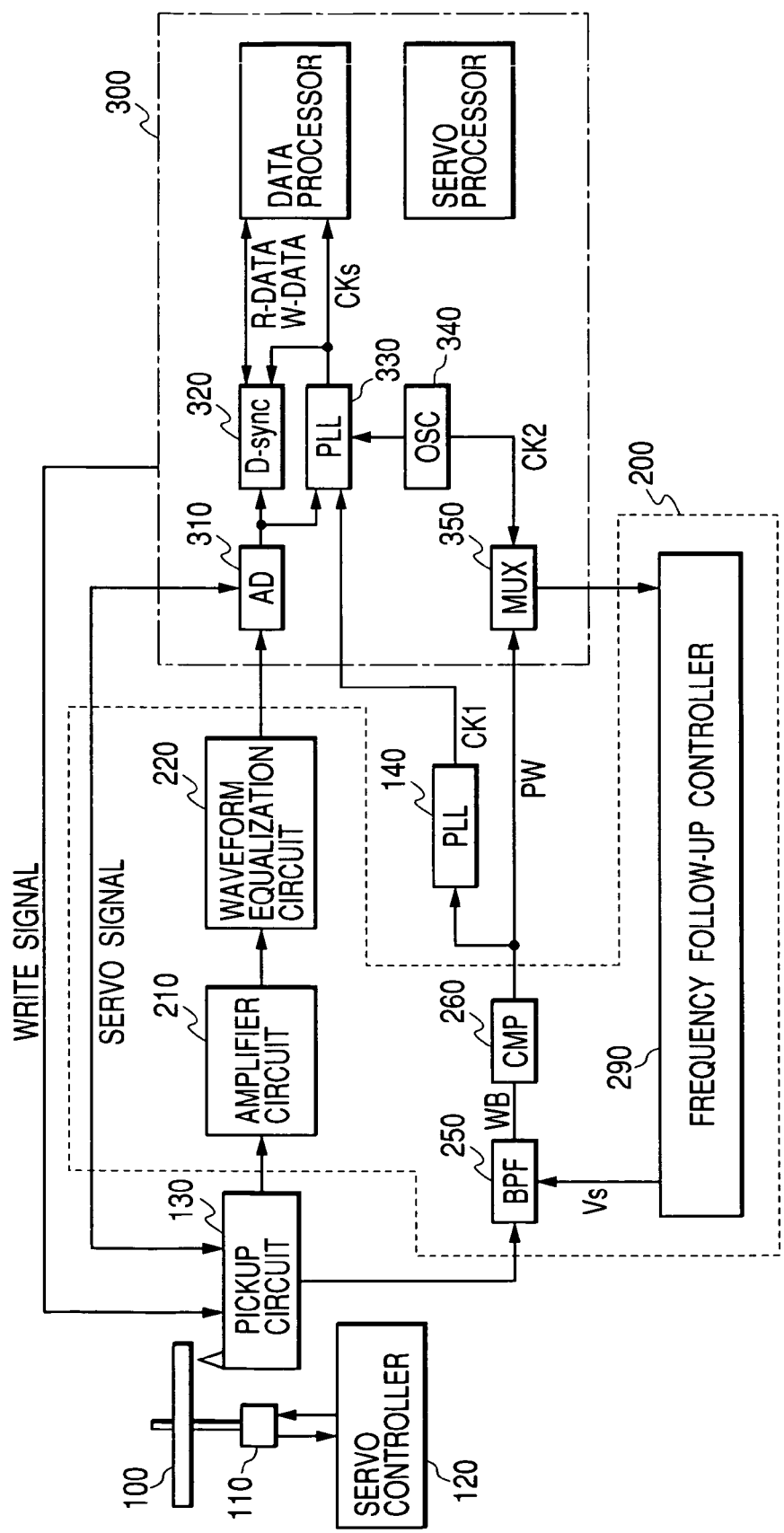
FIG. 1 is a block diagram showing one embodiment of a DVD device illustrated as one example of a disk type record playback device according to the present invention.

FIG. 1 shows one embodiment of a DVD device illustrated as one example of a disk type record playback device according to the present invention.

In FIG. 1, designated at numeral 100 is an optical disk which has recording tracks on its surface. Reference numeral 100 indicates a spindle motor for rotating the optical disk 100, and reference numeral 120 indicates a servo controller which controls the spindle motor 110 based on a rotational velocity signal outputted from the spindle motor 110 in such a manner that the spindle motor 110 is rotated at a predetermined velocity.

Referring also to FIG. 1, reference numeral 130 designates a pickup circuit which reads information recorded on the optical disk 100, amplifies its signal and outputs the amplified signal therefrom, reference numeral 210 designates an amplifier circuit which amplifies the signal outputted from the pickup circuit 130 such that it reaches predetermined amplitude, reference numeral 220 designates a waveform equalization circuit which emphasis-amplifies a high-frequency band of the attenuated read signal, reference numeral 300 designates a signal processing circuit which converts a playback analog signal outputted from the waveform equalization circuit 220 into a digital signal processable by a digital processing circuit and processes it, reference numeral 250 designates a bandpass filter (extraction filter) comprising a time-constant variable active filter, which extracts a wobble signal WB from the signal read from the pickup circuit 130, reference numeral 260 designates a comparator which compares the wobble signal WB outputted from the bandpass filter 250 and a reference voltage Vref, and digitizes the wobble signal WB, followed by being outputted to the signal processing circuit 300 as a pulse-shaped wobble signal PW, and reference numeral 290 designates a frequency follow-up circuit which controls a center frequency f0 of the bandpass filter 250 in accordance with the frequency of a clock signal outputted from the signal processing circuit 300. These circuits 210, 220, 250, 260 and 290 are formed on one semiconductor chip and configured as a semiconductor integrated circuit (hereinafter called an analog front end LSI). The analog front end LSI corresponds to a portion surrounded by a dotted line as reference numeral 200 in FIG. 1. Reference numeral 140 designates a phase synchronous circuit comprising a PLL (Phase Locked Loop) circuit which plays back a clock signal CK1 used as the reference from the digitized wobble signal PW.

The signal processing circuit 300 comprises an AD converter 310 which converts the playback analog signal outputted from the waveform equalization circuit 220 into a digital signal, a data synchronizer 320 which reproduces and outputs data DATA from the AD-converted signal, a phase synchronous circuit (PLL circuit) 330 which compares the clock signal CK1 outputted from the phase synchronous circuit 140 and a signal obtained by digitizing a read information signal to thereby generate an operation clock signal employed inside the signal processing circuit 300, an oscillator 340 which generates a clock signal CK2 used upon frequency pull-in of the PLL, a multiplexer 350 which selects the wobble signal PW extracted from the bandpass filter 250 and the comparator 260 or the clock signal CK2 outputted from the oscillator 340, etc.

In the DVD device shown in FIG. 1, the pickup circuit 130 amplifies signals read from the optical disk 100, and supplies a signal including record information to the amplifier circuit 210 and supplies a signal including a wobble signal to the bandpass filter 250. An information signal amplified to a predetermined amplitude value by the amplifier circuit 210 is inputted to the waveform equalization circuit 220, and its attenuated high-frequency band is emphasis-corrected, followed by being supplied to the signal processing circuit 300.

In the signal processing circuit 300, the AD converter 310 digitizes the supplied information signal for its digital processing and supplies it to the data synchronizer 320 where it is processed. The phase synchronous circuit 330 generates a synchronizing clock CKs from the digitized information signal. The data synchronizer 320 latches the information signal processed thereby in response to the synchronizing clock CKs, and outputs a synchronized read information signal R-DATA and the synchronizing clock CKs to a next-stage data processor.

The bandpass filter 250 extracts the wobble signal WB from the signal supplied from the pickup circuit 130. The comparator 260 brings the wobble signal WB into binary form, which in turn is supplied to the frequency follow-up circuit 290 as a rectangular wave signal. The frequency follow-up circuit 290 detects the frequency of the wobble signal on the basis of the wobble signal (pulse) PW outputted from the comparator 260 and generates and outputs such a control signal Vs as to cause the center frequency f0 of the bandpass filter 250 to coincide with the frequency of the wobble signal WB.

Upon start of the rotation of the disk and jumping of a pickup by random access, the frequency follow-up circuit 290 is supplied with a pull-in clock CK2 from the oscillator 340 of the signal processing circuit 300. The frequency follow-up circuit 290 generates and outputs such a control signal Vs as to allow the center frequency of the bandpass filter 250 to coincide with the frequency of the pull-in clock CK2. Thus, pseudo lock at the start of rotation of the disk or random access is avoided. Although not shown in the figure, a signal dropout compensating circuit for adding pulses dropped out from the wobble signal WB may be provided in a stage subsequent to the comparator 260.

The signal processing circuit 300 generates a write signal, based on supplied write data W-DATA and supplies it to the pickup circuit 130. The pickup circuit 130 writes information into the corresponding track on the surface of the disk 100 in accordance with the supplied write signal. Further, the signal processing circuit 300 also has the function of servo-controlling an actuator, based on a signal outputted from the actuator for moving the pickup, in such a manner that the pickup moves at a predetermined velocity.

Figure 2:
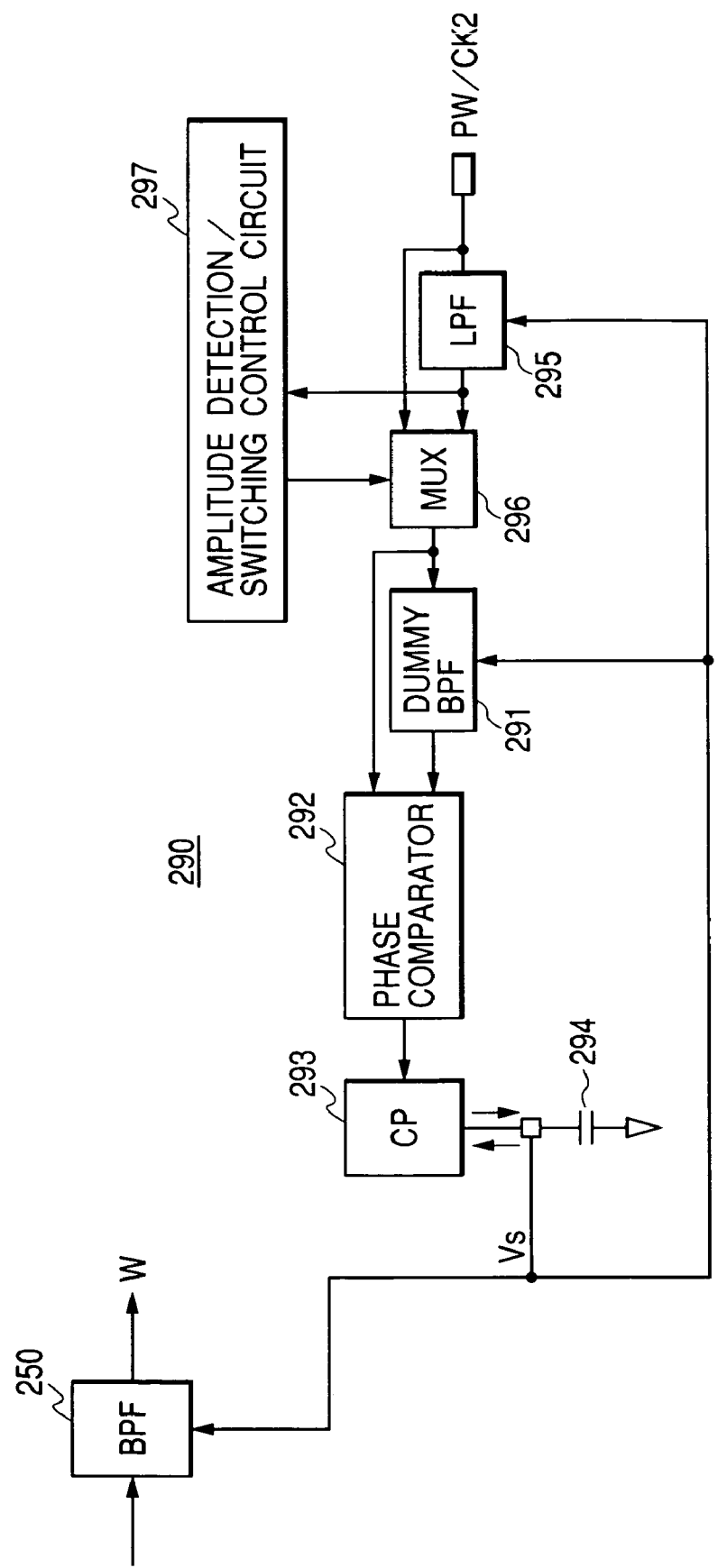
FIG. 2 is a block diagram depicting a configurational example of a frequency follow-up circuit which constitutes the DVD device.

A configurational example of the frequency follow-up circuit 290 is shown in FIG. 2.

The frequency follow-up circuit 290 according to the present embodiment includes a frequency follow-up control circuit which comprises a dummy filter 291, a phase comparator 292, a charge pump 293 and a smoothing capacitor 294 and generates a signal for controlling the center frequency of the bandpass filter 250, a low-pass filter 295 which eliminates harmonic components of the wobble signal (pulse) PW outputted from the comparator 260 of FIG. 1 and the clock signal CK2 outputted from the signal processing circuit 300 of FIG. 1, a multiplexer 296 which selects either the clock signal passed through the lowpass filter 295 or the clock signal that has bypassed it, a control circuit 297 which detects the amplitude of the signal whose harmonic components have been attenuated by the lowpass filter 295, thereby to generate a switching control signal of the multiplexer 296, etc.

When the control circuit 297 detects the amplitude of the signal passed through the lowpass filter 295 and the amplitude thereof is less than or equal to a predetermined level, the control circuit 297 generates and outputs the control signal for switching the multiplexer 296 to supply the signal having bypassed the lowpass filter 295 to the dummy filter 291. Incidentally, the control signal for switching the multiplexer 296 is outputted for a predetermined period of time alone and otherwise fed back. When the amplitude of the signal having passed through the lowpass filter 295 is still less than or equal to the predetermined level when the control signal for the multiplexer 296 is tentatively restored or fed back, the control circuit 297 is set up or constructed such that a control signal for switching the multiplexer 296 to the bypass side is outputted again.

In the frequency follow-up circuit 290, the lowpass filter 295 eliminates the harmonic components from the wobble signal (pulse) PW or the clock signal CK2 outputted from the signal processing circuit 300, which is selected by the multiplexer 296. Then the so-processed signal is supplied to the dummy filter 291. The dummy filter 291 has the property that the phase of an output signal monotonously increase with respect to an input frequency. When a control voltage Vs supplied from the smoothing capacitor 294 increases, the center frequency of the dummy filter 291 is taken high. When the control voltage Vs supplied from the smoothing capacitor 294 decreases in reverse, the center frequency of the dummy filter 291 is reduced.

Figure 3:
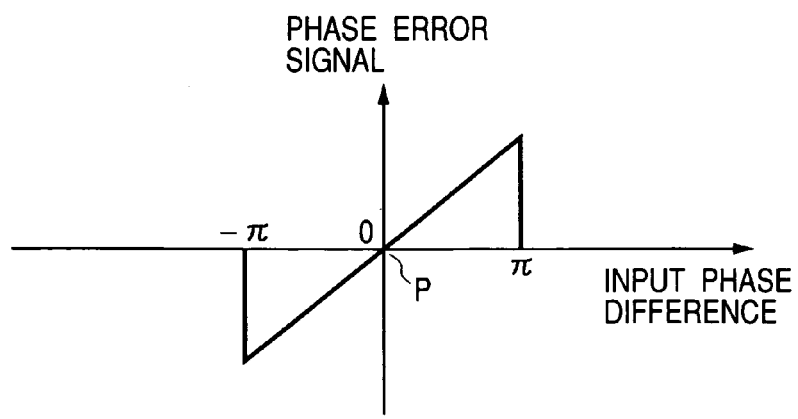
FIG. 3 is an explanatory view showing the relationship between input signal phase differences and an output signal (phase error signal) of a phase comparator which constitutes the frequency follow-up circuit.

FIG. 3 shows the characteristic of the phase comparator 292, in which two input signal phase differences of the phase comparator 292 are taken as the horizontal axis and an output signal of the phase comparator 292 is taken as the vertical axis. The phase comparator 292 is designed in such a manner that when the two input signal phase differences is 0 (point P in FIG. 3), the phase comparator 292 does not output a phase error signal and hence the charging voltage of the smoothing capacitor 294 is held at a constant value, and when the input signal phase differences become larger than 0, the charge pump 293 charges the smoothing capacitor 294 in accordance with a phase error signal outputted from the phase comparator 292 to increase its voltage, and when the input signal phase differences become smaller than 0 in reverse, the charge pump 293 causes the electrical charge of the smoothing capacitor 294 to be discharged in accordance with the phase error signal to thereby reduce its voltage.

Now consider where the frequency of the wobble signal PW inputted to the phase comparator 292 is a value of f1. When the phase difference between the input and output of the dummy filter 291 is smaller than 0 where this signal is supplied to the dummy filter 291, the charging voltage of the smoothing capacitor 294 is reduced by the phase error signal outputted from the phase comparator 292, so that the cutoff frequency of the dummy filter 291 is controlled so as to become low by such a charging voltage. In doing so, the phase difference between the input and output of the dummy filter 291 at the frequency f1 is further reduced due to the primary phase-shift circuit characteristic of the dummy filter 291. When such a feedback loop operation is repeated and the input-to-output phase difference at the dummy filter 291 becomes 0 soon, the phase error signal outputted from the phase comparator 292 reaches "0". Since the smoothing capacitor 294 holds a voltage value at that time, the input-to-output phase difference at the dummy filter 290 is also held at 0.

Next consider where the frequency of the wobble signal PW is changed to a value f2 larger than f1. When done so, the input-to-output phase difference of the dummy filter 291 is 0 at the frequency f1, whereas it becomes larger than 0 at the frequency f2. Thus, the charging voltage of the smoothing capacitor 294 begins to rise by the phase error signal outputted from the phase comparator 292, so that the cutoff frequency of the dummy filter 291 is controlled so as to become high, and the input-to-output phase difference of the dummy filter 291 at the frequency f2 is decreasing toward 0. When the input-to-output phase difference of the dummy filter 291 at the frequency f2 reaches 0 in time, the phase error signal outputted from the phase comparator 292 becomes "0", so the charging voltage of the smoothing capacitor 294 holds a value at that time. Therefore, the input-to-output phase difference of the dummy filter 291 is also held at 0.

The frequency follow-up circuit 290 according to the present embodiment as described above is controlled in such a manner that the phase difference between the input and output of the dummy filter 291 becomes 0 at the frequency of the input signal. That is, such control that the cutoff frequency of the dummy filter 291 follows a fluctuation in the frequency of the wobble signal WB is performed. Further, the dummy filter 291 is set similar in circuit configuration to the bandpass filter 250 and made identical in center frequency control signal thereto. Consequently, the two bandpass filters have similar frequency characteristics. Thus, even if the frequency of the wobble signal WB fluctuates, it is possible to cause the center frequency of a signal passband of the bandpass filter 250 to follow the frequency of the wobble signal WB so as to coincide with the frequency thereof in a manner similar to the dummy filter 291.

As a result, there is no need to expand the signal passband of the bandpass filter 250 to greater than the frequency band of the wobble signal WB. It is also possible to prevent a S/N ratio from being deteriorated due to the mixing of noise or other read signals into the wobble signal WB. Further, since a fluctuation in the center frequency of the bandpass filter 250 due to variations in the absolute values of a resistor and a condenser element in the case where the frequency follow-up circuit is brought into semiconductor integrated circuit form, is also corrected with the frequency of the wobble signal WB as the reference, the frequency follow-up circuit 290 according to the present embodiment is suitable for being brought into the semiconductor integrated circuit form.

Further, the follow-up circuit 290 according to the present embodiment is controlled in such a manner that the cutoff frequency of the lowpass filter 295 is variably set up, the charging voltage of the smoothing capacitor 294 is fed back to the lowpass filter 295, and the cutoff frequency fc of the lowpass filter 295 is changed following the center frequency of the dummy filter 291 and the center frequency f0 of the bandpass filter 250. Described specifically, when the center frequency f0 of the bandpass filter 250 is lowered, the cutoff frequency fc of the lowpass filter 295 is also reduced. When the center frequency f0 of the bandpass filter 250 is rendered high, the cutoff frequency fc of the lowpass filter 295 is also raised.

Figure 11:
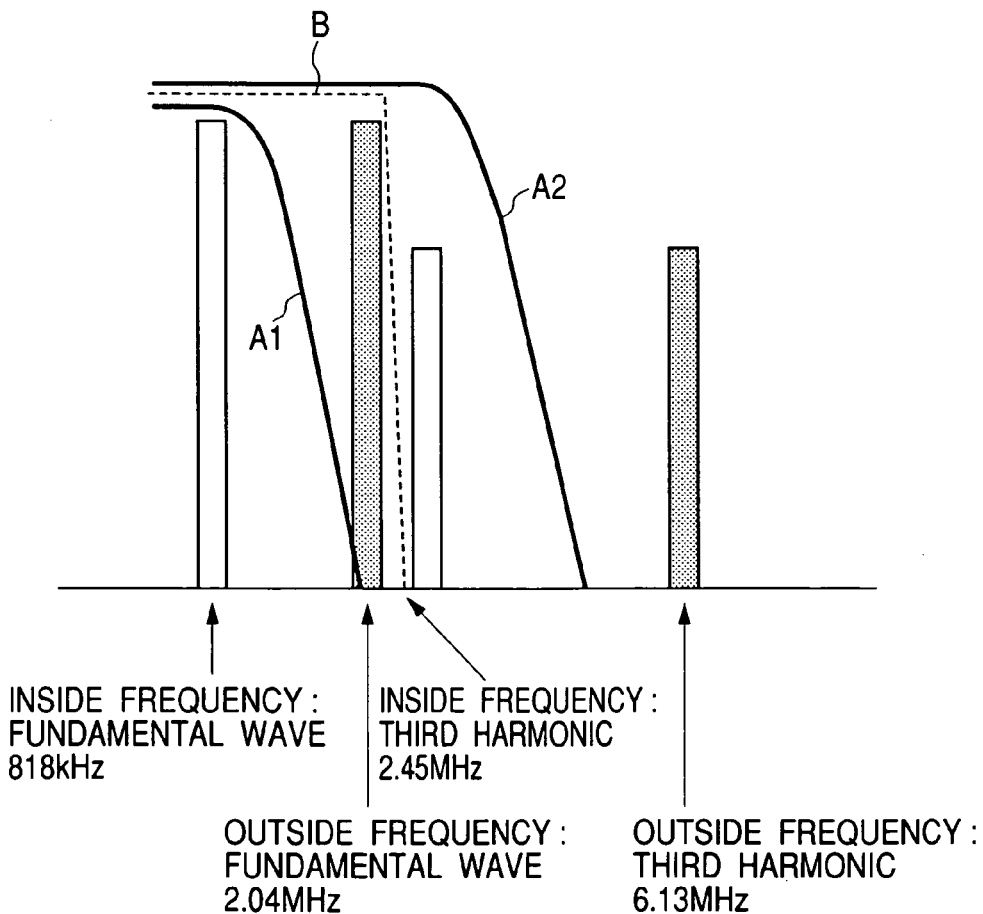
FIG. 11 is a spectrum diagram showing frequencies of a wobble signal employed in a CAV type DVD device and a frequency distribution of its harmonics.

When the cutoff frequency fc of the lowpass filter 295 is being fixed in the CAV type DVD device, its frequency characteristic must be set so as to fall within such an extremely narrow range that fc lies between, for example, 2.04 MHz and 2.45 MHz as indicated by a broken line B in FIG. 11. Thus, it becomes very difficult to realize it. On the other hand, the frequency of a third harmonic of a clock signal where the pickup is placed on the outer periphery of the disk (clock frequency is 2.04 MHz) is 6.13 MHz. Thus, if the cutoff frequency fc of the lowpass filter 295 is variable as in the present embodiment, then the frequency required of the lowpass filter may be a gradual one as indicated by each of solid lines A1 and A2 in FIG. 11.

Applying the present embodiment to the CAV type DVD device makes it possible to optimally control the center frequency f0 of the bandpass filter 250 and the cutoff frequency fc of the lowpass filter 295 according to the position of the pickup even when the pickup is placed inside the disk and is moving toward the outside of the disk. It is further possible to eliminate harmonic components of the pulse signal PW generated based on the extracted wobble signal WB and noise of the read signal and thereby execute high-accuracy frequency follow-up control.

The reason why the center frequency of the bandpass filter 250 is controlled to 0 by phase comparison between the input and output in a frequency follow-up control loop containing the dummy filter 291 and the phase comparator 292, will now be explained using FIG. 4.

Figure 4A:
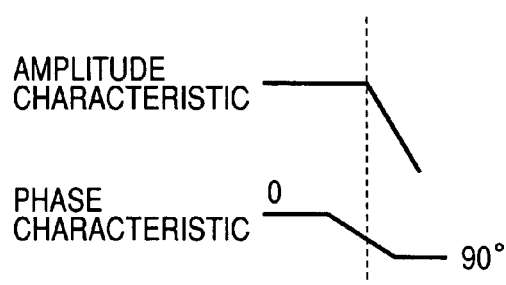
FIG. 4 is an explanatory view illustrating phase characteristics of bandpass filter.
Figure 4B:
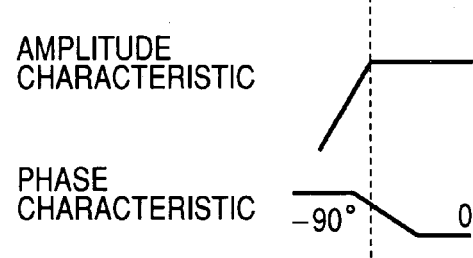
Figure 4C:
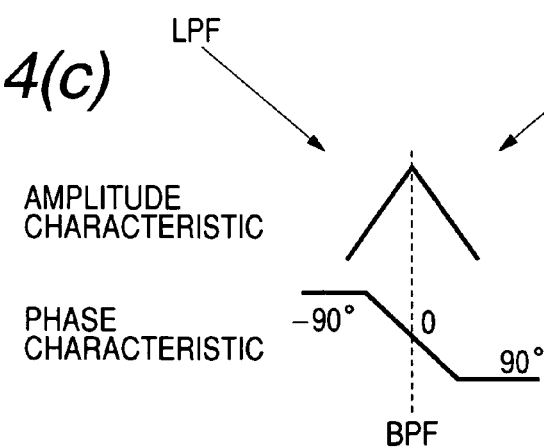

The bandpass filter can be considered to result in such a characteristic as shown in FIG. 4(c) obtained by combining such a characteristic of lowpass filter as shown in FIG. 4(a) and such a characteristic of high-pass filter as shown in FIG. 4(b). On the other hand, if a high-pass amplitude characteristic and a low-pass amplitude characteristic of the bandpass filter are symmetrical to each other, then phase characteristics are also symmetrical to each other, and the phase becomes "0" at the center frequency. Thus, when a sine wave having the same frequency as the center frequency of the bandpass filter having such characteristics is inputted to the bandpass filter, the phase difference between the input and output thereof reaches "0". When the frequency of the input is high, the phase of the output lags, whereas when the frequency of the input is low, the phase of the output leads.

In the frequency follow-up circuit 290 according to the above-described embodiment, the center frequency of the bandpass filter is controlled using such characteristics of the bandpass filter such that the phase difference between the input and output of the dummy filter 291 reaches "0", thereby causing the frequency of the input and the center frequency of the filter to coincide with each other. Since the signal for controlling the frequency of the dummy filter 291 is supplied to the bandpass filter 250 identical in configuration thereto to thereby control its center frequency, the center frequency of the bandpass filter 250 can be controlled so as to coincide with the frequency of the input.

Specific circuit configurational examples of the bandpass filter 250, the dummy filter 291 and the lowpass filter 295 will next be described using FIGS. 5 through 7. In the present embodiment, although not restricted in particular, the bandpass filter 250, the dummy filter 291 and the lowpass filter 295 are respectively configured as secondary active filters using voltage input-current output type amplifier circuits (hereinafter called gm amplifiers).

Figure 5:
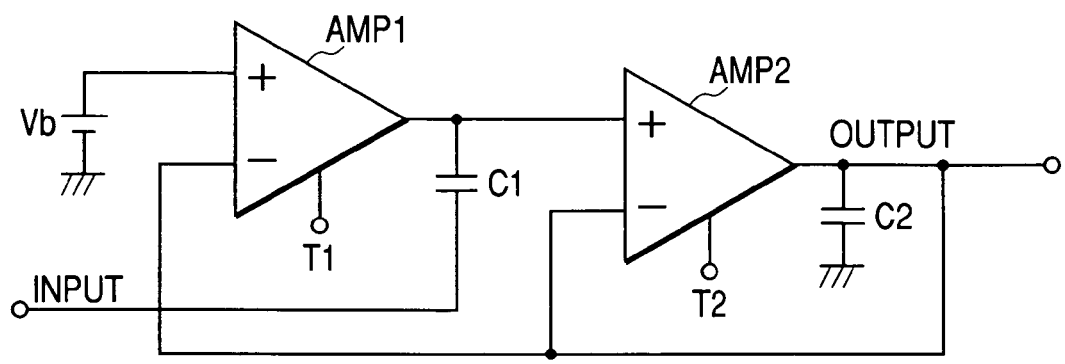
FIG. 5 is a circuit configurational diagram showing a configurational example of the bandpass filter.
Figure 6:
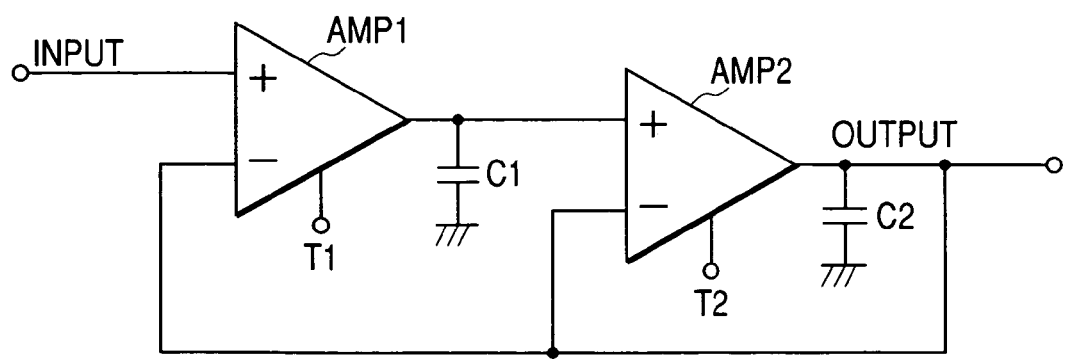
FIG. 6 is a circuit configurational diagram illustrating a configurational example of a low-pass filter.
Figure 7:
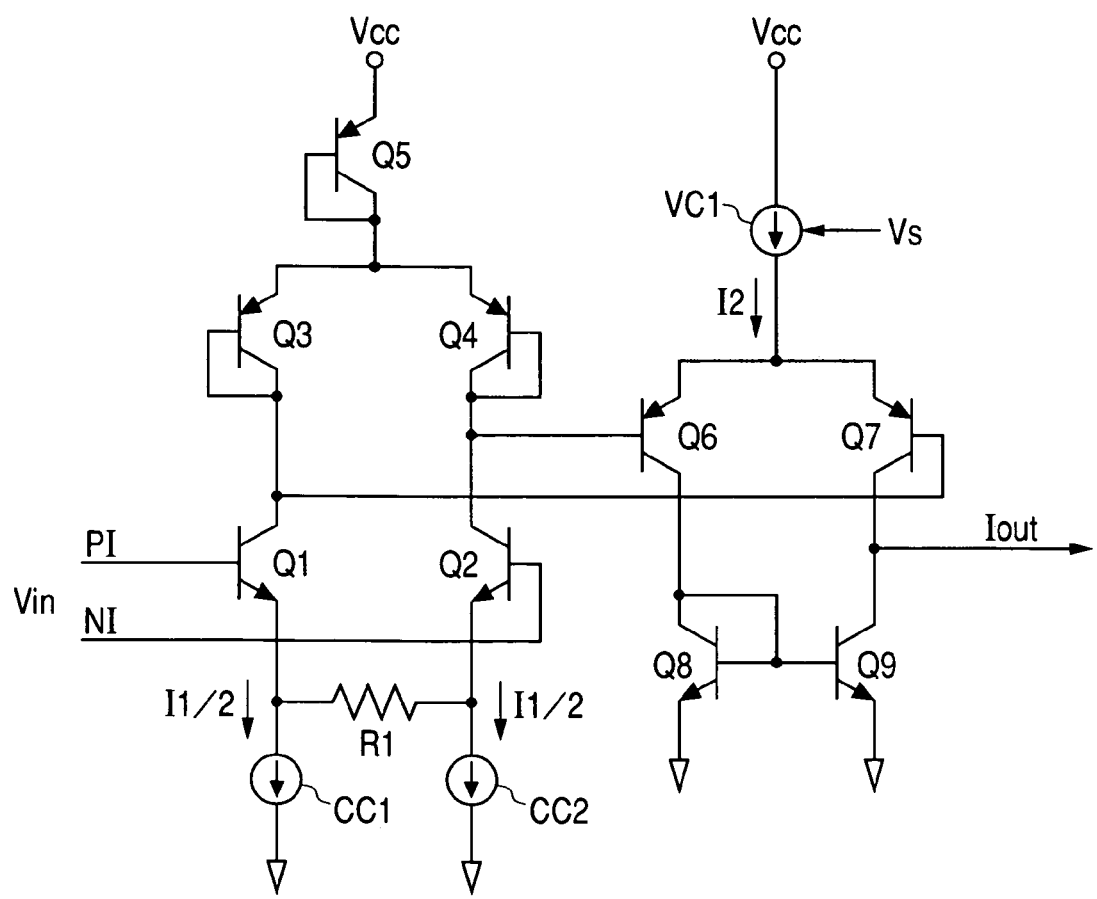
FIG. 7 is a circuit diagram showing a specific example of a gm amplifier which constitutes each of the bandpass filter shown in FIG. 4 and the lowpass filter shown in FIG. 6.

Of FIGS. 5 through 7, FIG. 5 shows a configurational example of each of the bandpass filter 250 and the dummy filter 291, FIG. 6 shows a configurational example of the lowpass filter 295, and FIG. 7 shows a configurational example of the gm amp, respectively.

The bandpass filter 250 is configured as shown in FIG. 5. That is, two gm amplifier AMP1 and gm amplifier AMP2 are connected in tandem, and condensers C1 and C2 are respectively connected to output terminals of the gm amplifier AMP1 and gm amplifier AMP2. A reference voltage Vb is applied to a non-inversion input terminal of the pre-stage gm amplifier AMP1, and an output signal of the subsequent-stage gm amplifier AMP2 is feedback-inputted to an inversion input terminal thereof. An output signal of the pre-stage gm amplifier AMP1 is inputted to a non-inversion input terminal of the subsequent-stage gm amplifier AMP2, and the output signal of the gm amplifier AMP2 per se is feedback-inputted to an inversion input terminal thereof. An input signal (wobble signal WB) is inputted to the non-inversion input terminal of the subsequent-stage gm amplifier AMP2 via the condenser C1. The other terminal of the condenser C2 connected to the output terminal of the subsequent-stage gm amplifier AMP2 is connected to a ground point. T1 and T2 indicate input terminals to each of which a signal for controlling the center frequency is supplied.

The lowpass filter 295 is analogous to the bandpass filter 250 of FIG. 5 as shown in FIG. 6. Two gm amplifier AMP1 and gm amplifier AMP2 are connected in tandem. Condensers C1 and C2 are respectively connected to output terminals of the gm amplifier AMP1 and gm amplifier AMP2, whereas the other terminals of the condensers C1 and C2 are both connected to a ground point. An input signal (wobble signal WB) is inputted to a non-inversion input terminal of the pre-stage gm amplifier AMP1, and an output signal of the subsequent-stage gm amplifier AMP2 is feedback-inputted to its inversion input terminal. An output signal of the pre-stage gm amplifier AMP1 is inputted to a non-inversion input terminal of the subsequent-stage gm amplifier AMP2, and the output signal of the gm amplifier AMP2 per se is feedback-inputted to an inversion input terminal of the gm amplifier AMP2.

As each of the gm amplifiers AMP1 and AMP2, may be used, for example, a circuit having such a configuration as shown in FIG. 7.

The gm amp shown in FIG. 7 comprises an NPN bipolar transistor Q1 whose base is connected to a non-inversion input terminal PI, an NPN bipolar transistor Q2 whose base is connected to an inversion input terminal NI, constant current sources CC1 and CC2 connected between the emitters of the transistors Q1 and Q2 and ground potentials, a resistor R1 connected between the emitters of the transistors Q1 and Q2, PNP load transistors Q3 and Q4 respectively connected to the collectors of the transistors Q1 and Q2, a PNP transistor Q5 connected between the common emitters of the transistors Q3 and Q4 and a power supply voltage terminal Vcc, PNP transistors Q6 and Q7 whose bases are respectively connected to the collectors of the input transistors Q1 and Q2, NPN load transistors Q8 and Q9 connected between the collectors of the transistors Q6 and Q7 and the ground potentials, and a variable current source VC1 connected between the common emitters of the transistors Q6 and Q7 and the power supply voltage terminal Vcc.

The transistors Q3 through Q5 are respectively configured as so-called diode-connections in which their bases and collectors are connected to one another. An input voltage Vin is brought into logarithmic function form owing to such a diode load. The transistors Q8 and Q9 have the bases common-connected to each other. The base of the transistor Q8 is connected to its emitter, and the transistors Q8 and Q9 constitute a current mirror circuit. A differential stage comprising the transistors Q6 through Q9 brings a voltage inputted from the pre-stage to an exponential function to thereby output a current Iout proportional to the input voltage. Assuming that currents flowing through the constant current sources CC1 and CC2 are defined as I1/2, and a current I2 flowing through the variable current source VC1 is defined as I2, gain gm (=Iout/Vin) of the gm amp according to the present embodiment is expressed in the following equation:

$$gm = (1/R1) \cdot (I2/I1)$$

Further, the gm amp according to the present embodiment is controlled in such a manner that the charging voltage Vs of the smoothing capacitor 294 in the frequency follow-up circuit 290 of FIG. 2 is applied to a control terminal of the variable current source VC1 to feed the current I2 corresponding to the voltage Vs. Therefore, the bandpass filter of FIG. 5 and the lowpass filter of FIG. 6 each using the gm amp are set such that their cutoff frequencies vary according to time constants determined by the magnitudes of the current I2 and the condensers C1 and C1.

Incidentally, while the gm amp shown in FIG. 7 is configured such that the current I2 flowing through the variable current source VC1 is changed by the voltage to thereby change gm, it may be feasible to, for example, replace the variable current source VC1 with a bipolar transistor, provide a voltage-current converting transistor current-mirror connected to the transistor, and apply the charging voltage Vs of the smoothing capacitor 294 to the collector of the transistor to thereby change the current I2 flowing through the variable current source VC1 by current control.

Figure 8:
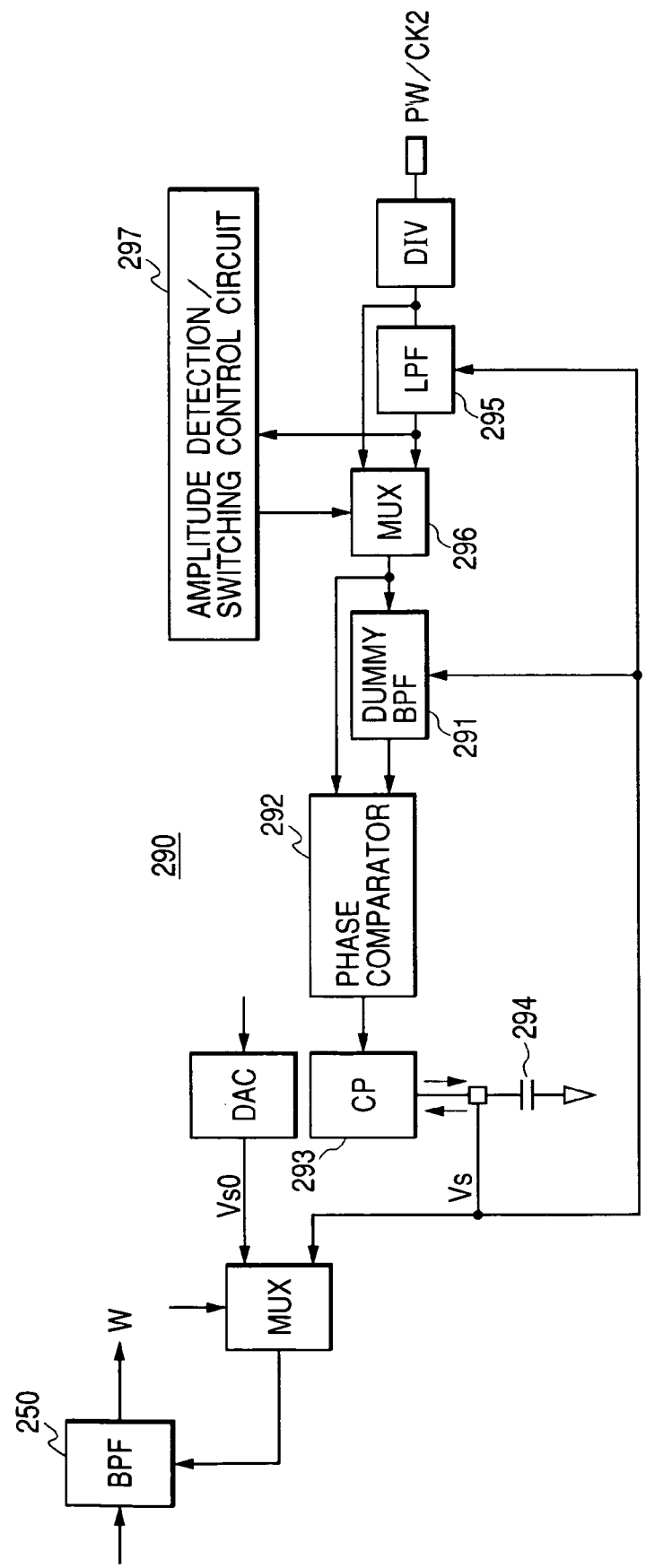
FIG. 8 is a block diagram illustrating another configurational example of the frequency follow-up circuit that constitutes the DVD device.

FIG. 8 shows another embodiment of the frequency follow-up circuit 290 shown in FIG. 1.

The present embodiment is an embodiment which enables both CAV type control and CLV type control, which is provided with a DA converter DAC which DA-converts a command code issued from a signal processing circuit 300 to generate a control voltage Vs0, and a multiplexer MUX which selects a signal to be supplied to a bandpass filter 250 according to modes. The multiplexer MUX supplies a charging voltage Vs of a smoothing capacitor 294 to the bandpass filter 250 in a CAV mode and supplies the output of the DA converter DAC to the bandpass filter 250 in a CLV mode.

In the CLV mode, the rotation of the disk is controlled such that the linear velocity, i.e., relative velocity of the pickup becomes constant, and the frequency of a wobble signal WB becomes constant. Therefore, the bandpass filter 250 is controlled by the command issued from the signal processing circuit 300 such that its center frequency is held at a predetermined value. A control signal for switching the multiplexer MUX can be supplied from the signal processing circuit 300 according to the respective modes.

In the present embodiment as well, a frequency divider DIV, which divides a wobble signal PW outputted from a comparator 260 to lower the frequency, is provided in a preceding stage of a lowpass filter 295. Providing the frequency divider DIV makes it possible to expand the degree of freedom of a clock frequency outputted from the signal processing circuit 300.

Figure 9:
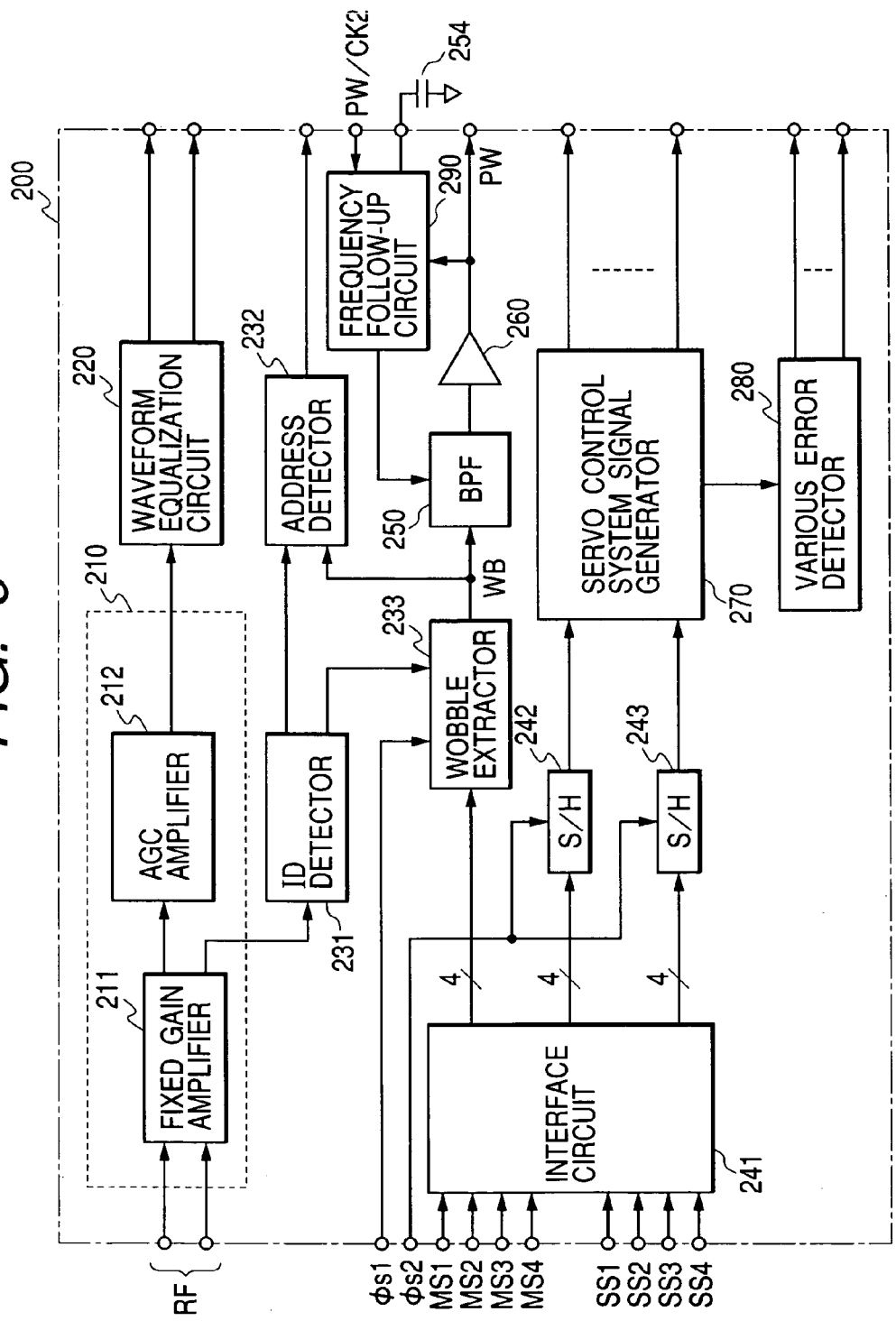
FIG. 9 is a block diagram showing a configurational example of an analog front end LSI for the DVD device having the frequency follow-up circuit according to the embodiment.
Figure 10:
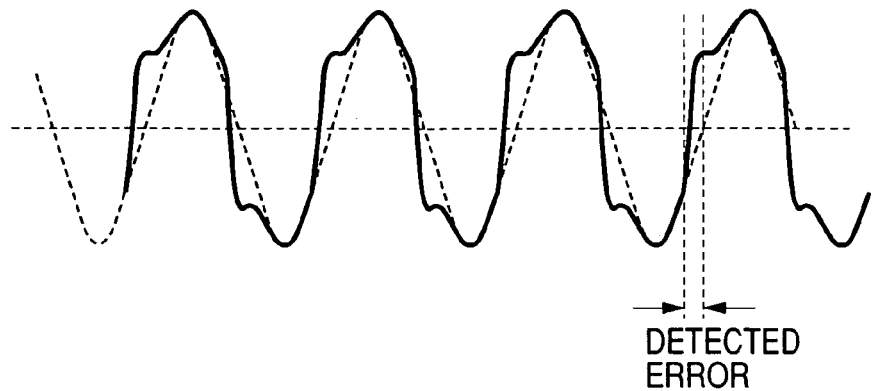
FIG. 10 is a waveform diagram illustrating a waveform of a signal after having a post-filtered signal where a primary filter is used as a lowpass filter of a frequency follow-up circuit.

FIG. 9 shows a configurational example of an analog front end LSI having the frequency follow-up circuit 290 according to the above embodiment. Although not restricted in particular, a portion surrounded by a dashed line 200 in FIG. 9 indicates the analog front end LSI, which is formed as a semiconductor integrated circuit on one semiconductor chip like monocrystal silicon. In FIG. 9, the same circuits as those shown in FIGS. 1 and 2 are respectively identified by the same reference numerals, and the description of certain common ones will be omitted.

Referring to FIG. 9, reference numeral 211 indicates a fixed gain amplifier which amplifies a high-frequency signal RF including record information supplied from a pickup as a differential signal, reference numeral 212 indicates a gainable AGC circuit which amplifies a signal so as to reach predetermined amplitude, reference numeral 220 indicates a waveform equalization circuit which emphasis-amplifies a high frequency band of an attenuated read signal, reference numeral 231 indicates an ID detector which detects that an ID portion of a disk has been played back from the amplified signal, and reference numeral 232 indicates an address detector which detects an address of each track. The detected address is outputted from an external terminal to a signal processing circuit 300 provided outside the figure. In the analog front end LSI 200 according to the present embodiment, although not restricted in particular, a smoothing capacitor 294 that constitutes the frequency follow-up circuit 290 is connected to an external terminal as an external capacitor.

Signals supplied from the pickup to the analog front end LSI 200 include servo control detection signals in which DC components take on the meaning, in addition to the high frequency signal RF in which an AC component takes on the meaning. As the servo control detection signals, may be mentioned, four main 4D signals MS1 through MS4 and four sub 4D signals SS1 through SS4. A head portion of the pickup is provided with, for example, four sensors. The eight servo control detection signals are generated based on signals detected by the respective sensors, which are supplied to the analog front end LSI 200. These signals are taken or fetched therein by an interface circuit 241 and held or retained in sample-and-hold circuits 242 and 243 in synchronism with a sampling clock φs2 supplied from the signal processing circuit 300, which in turn are passed to a servo control system signal generator 270.

The servo control system signal generator 270 generates signals for servo-controlling an actuator for moving the pickup in a diameter direction and a focusing actuator on the basis of detection signals supplied from the pickup and outputs the same to the outside of a chip. These signals are supplied to the signal processing circuit 300, and control signals generated by the signal processing circuit 300 are supplied to the pickup to perform servo control.

In addition to the above circuits, the analog front end LSI 200 according to the embodiment is provided with a wobble extractor 233 which combines the main 4D signals MS1 through MS4 supplied from the pickup to generate a wobble signal WB to be supplied to the bandpass filter 250, and an error detector 280 which detects various errors to generate error signals and outputs the same to the outside of the chip.

The wobble extractor 233 comprises adders that respectively add the main 4D signals MS1 through MS4 by two thereof, and a difference circuit which determines the difference between the added two signals. Even if the center of the head of the pickup is shifted from the corresponding track or the head is inclined, an accurate wobble signal can be generated by such an arithmetic operation as compared with a case in which a wobble signal is extracted from a detected signal of any one sensor. Incidentally, buffers each having a mixing function, which respectively add the main 4D signals MS1 through MS4 by two thereof, are provided for the interface circuit 241, whereby the wobble extractor 233 may be constituted of only a difference circuit which determines the difference between the added two signals.

While the invention made above by the present inventors has been described specifically based on the illustrated embodiments, the present invention is not limited to the above embodiments. It is needless to say that various changes can be made thereto within the scope not departing from the gist thereof. While the signal PW obtained by digitizing the wobble signal WB extracted by the bandpass filter 250 by means of the comparator 260 is inputted to the lowpass filter 295 via the multiplexer 350 in the above embodiment, for example, the wobble signal WB may be supplied to the dummy filter 291 via the multiplexer 296 without involving the comparator 260 and the lowpass filter 295.

Even in this case, it is necessary to cause the clock CK2 (pulse) supplied from the oscillator 340 of the signal processing circuit 300 to pass through the lowpass filter 295 upon frequency pull-in to remove harmonic components and supply it to the dummy filter 291 via the multiplexer 296. Therefore, high-accuracy control is enabled by application of the above embodiment for controlling the cutoff frequency of the lowpass filter 295 according to the center frequency of the dummy filter 291.

While the secondary active filters have been used as the bandpass filter 250, dummy filter 291 and lowpass filter 295 in the above embodiment, tertiary and more active filters may be used.

While the above description has principally been made of the case in which the invention made by present inventors is applied to the DVD device which belongs to the field of application reaching the background of the invention, the present invention is not limited to it. The present invention can be applied even to record playback devices such as a writable CD-W, a CD-RW, an MD (Mini Disk), etc.

Advantageous effects obtained by representative ones of the inventions disclosed in the present application will be described in brief as follows:

According to the present invention, a frequency variable filter is used as a lowpass filter for removing harmonic components from a frequency follow-up clock signal. Therefore, when the invention is applied to a CAV type DVD device, the cutoff frequency of the lowpass filter is changed according to the position of a pickup in its diameter direction to thereby make it possible to more effectively eliminate harmonic components of a clock signal supplied to a phase comparator.

Thus, a disk type record playback device having a wobble signal extracting bandpass filter for controlling a filter's center frequency according to a frequency follow-up control loop including a dummy filter identical in configuration to a filter to be controlled, and a phase comparator is capable of controlling the center frequency of the bandpass filter with more satisfactory accuracy.

What is claimed is:

1. A semiconductor integrated circuit comprising:
   a time-constant variable bandpass filter which extracts a signal attributable to wobble from a signal outputted from a pickup circuit for scanning a surface of a recording medium formed with a track having in a surface thereof the wobble to thereby read a signal;
   a digitizing circuit which digitizes a wobble signal having passed through the bandpass filter; and
   a filter frequency control circuit which generates a control signal for controlling a frequency characteristic of the bandpass filter in accordance with the frequency of the wobble signal having passed through the bandpass filter,
   wherein the filter frequency control circuit includes,
   a lowpass filter for eliminating harmonic components of a signal outputted from the digitizing circuit,
   a dummy filter identical in configuration to the bandpass filter,
   a phase comparator which detects a difference in phase between a signal having passed through the dummy filter and a signal having not passed therethrough, and
   a control signal generator which generates a frequency control signal for controlling an intermediate frequency of the bandpass filter according to the phase difference on the basis of a signal outputted from the phase comparator, and
   wherein the intermediate frequency of the dummy filter and the cutoff frequency of the lowpass filter are controlled in conjunction with the intermediate frequency of the bandpass filter on the basis of the frequency control signal.

2. A semiconductor integrated circuit according to claim 1, further-comprising:
   a bypass path which supplies the signal outputted from the digitizing circuit to the dummy filter not through the lowpass filter,
   switching means which causes any of the signal from the bypass path and the signal having passes through the lowpass filter to selectively pass therethrough, and
   a control circuit which detects the amplitude of the signal having passed through the lowpass filter, and controls the switching circuit and supplies the signal having passed through the bypass path to the dummy filter when the amplitude is less than or equal to a predetermined level.

3. A semiconductor integrated circuit according to claim 1, wherein the lowpass filter and the dummy filter are continuous filters.

4. A semiconductor integrated circuit according to claim 3, wherein the lowpass filter and the dummy filter are secondary or more active filters.

5. A semiconductor integrated circuit according to claim 1, further comprising:
   a D/A converter which D/A-converts a command value for designating the intermediate frequency of the bandpass filter, and
   second switching means which causes either a signal outputted from the D/A converter or the control signal outputted from the control signal generator to selectively pass therethrough,
   wherein the second switching means causes the control signal outputted from the control signal generator to pass therethrough in a first mode and causes the output signal of the D/A converter to pass therethrough in a second mode.

6. A semiconductor integrated circuit according to claim 1, further comprising:
   a frequency divider which divides a signal prior to being transmitted through the lowpass filter.

* * * * *